(12) United States Patent
Fujino et al.

(10) Patent No.: US 10,804,078 B2
(45) Date of Patent: Oct. 13, 2020

(54) PLASMA PROCESSING APPARATUS AND GAS INTRODUCTION MECHANISM

(71) Applicant: TOKYO ELECTRON LIMITED, Tokyo (JP)

(72) Inventors: Yutaka Fujino, Yamanashi (JP); Tomohito Komatsu, Yamanashi (JP); Taro Ikeda, Yamanashi (JP); Jun Nakagomi, Yamanashi (JP); Takeo Wakutsu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 406 days.

(21) Appl. No.: 15/488,232

(22) Filed: Apr. 14, 2017

(65) Prior Publication Data
US 2017/0309452 A1   Oct. 26, 2017

(30) Foreign Application Priority Data

Apr. 26, 2016 (JP) .................................. 2016-088185

(51) Int. Cl.
*H01J 37/32* (2006.01)
(52) U.S. Cl.
CPC .... *H01J 37/3244* (2013.01); *H01J 37/32192* (2013.01); *H01J 37/32201* (2013.01); *H01J 37/32229* (2013.01); *H01J 37/32247* (2013.01); *H01J 37/32458* (2013.01); *H01J 37/32715* (2013.01); *H01J 2237/334* (2013.01); *H01J 2237/3321* (2013.01)

(58) Field of Classification Search
None
See application file for complete search history.

(56) References Cited

U.S. PATENT DOCUMENTS

| | | | |
|---|---|---|---|
| 5,445,709 A * | 8/1995 | Kojima | ............ H01J 37/32009 438/729 |
| 2002/0111000 A1 | 8/2002 | Kawakami et al. | |
| 2008/0213504 A1* | 9/2008 | Ishikawa | ........... C23C 16/45565 427/569 |

(Continued)

FOREIGN PATENT DOCUMENTS

| | | |
|---|---|---|
| CN | 102196654 | 9/2011 |
| CN | 102458032 A | 5/2012 |

(Continued)

*Primary Examiner* — Jethro M. Pence
(74) *Attorney, Agent, or Firm* — Fenwick & West LLP (57) ABSTRACT

A plasma processing apparatus includes a chamber, a mounting table for mounting thereon a target object in the chamber, a plasma source configured to introduce microwaves into the chamber through a ceiling wall of the chamber and generate a surface wave plasma in the chamber, a first gas introduction unit for introducing a first gas into the chamber from the ceiling wall, and a second gas introduction unit for introducing a second gas into the chamber from a location between the ceiling wall and the mounting table. The second gas introduction unit includes a ring-shaped member having a plurality of gas injection holes and provided at a predetermined height position between the ceiling wall and the mounting table, and a leg part which connects the ceiling wall and the ring-shaped member. The second gas is supplied to the ring-shaped member through the leg part.

13 Claims, 7 Drawing Sheets

(56) References Cited

U.S. PATENT DOCUMENTS

| | | |
|---|---|---|
| 2009/0159214 A1 | 6/2009 | Kasai |
| 2009/0311869 A1 | 12/2009 | Okesaku et al. |
| 2012/0090782 A1 | 4/2012 | Ikeda et al. |
| 2012/0247675 A1 | 10/2012 | Ikeda et al. |

FOREIGN PATENT DOCUMENTS

| | | |
|---|---|---|
| JP | 2000-294550 | 10/2000 |
| JP | 2005-142448 A | 6/2005 |
| JP | 2008-047883 | 2/2008 |
| JP | 2012-089334 A | 5/2012 |
| JP | 2012-216525 | 11/2012 |
| KR | 10-2011-0046295 A | 5/2011 |
| KR | 10-2011-0095824 A | 8/2011 |
| WO | 2008/013112 | 1/2008 |

* cited by examiner

PLASMA PROCESSING APPARATUS AND GAS INTRODUCTION MECHANISM

CROSS-REFERENCE TO RELATED APPLICATIONS

This application claims priority to Japanese Patent Application No. 2016-088185 filed on Apr. 26, 2016, the entire contents of which is incorporated herein by reference.

FIELD OF THE INVENTION

The disclosure relates to a plasma processing apparatus and a gas introduction mechanism used in the plasma processing apparatus.

BACKGROUND OF THE INVENTION

Plasma processing is a technique that is necessary to manufacture semiconductor devices. Recently, due to demands for high-integration and high-speed of LSI (Large Scale Integrated circuit), a design rule of the semiconductor devices constituting the LSI is further miniaturized and a semiconductor wafer is scaled up. Accordingly, a plasma processing apparatus needs to cope with such miniaturization and scaling up.

As for the plasma processing apparatus, a parallel plate type plasma processing apparatus and an inductively coupled plasma processing apparatus have been conventionally used. However, it is difficult for the parallel plate type plasma processing apparatus and the inductively coupled plasm processing apparatus to uniformly and quickly perform plasma processing on a scaled-up semiconductor wafer.

Therefore, an RLSA (registered trademark) microwave plasma processing apparatus capable of uniformly generating a surface wave plasma having a high density and a low electron temperature attracts attention (see, e.g., Japanese Patent Application Publication No. 2000-294550).

In the RLSA microwave plasma processing apparatus, a planar slot antenna having a plurality of slots formed in a predetermined pattern is provided, as a microwave radiating antenna for radiating a microwave for generating a surface wave plasma, at an upper portion of a chamber. A microwave generated from a microwave generation source is radiated from the slots of the antenna into the chamber maintained in a vacuum state through a microwave transmission plate that is made of a dielectric material and forms a ceiling wall of the chamber. A surface wave plasma is generated in the chamber by a microwave magnetic field. Accordingly, a target object such as a semiconductor wafer or the like is processed.

Meanwhile, PCT Publication No. 2008/013112 discloses a plasma source for dividing a microwave into a plurality of microwaves, guiding microwaves radiated from a plurality of microwave radiation mechanisms provided at a top surface of the chamber into a chamber and spatially combining a plasma in the chamber, each of the microwave radiation mechanisms having the above-described planar antenna and a tuner for matching an impedance. By spatially combining the plasma by using the plurality of microwave radiation mechanisms, it is possible to individually control phases and intensities of the microwaves introduced from the microwave radiation mechanism and also possible to relatively easily control plasma distribution.

In the apparatuses disclosed in Japanese Patent Application Publication No. 2000-294550 and PCT Publication No. 2008/013112, a processing gas is supplied from sidewall of the chamber. Therefore, the controllability of flow of the processing gas in the chamber is poor and it is difficult to uniformly introduce the processing gas. As a solution to such problems, Japanese Patent Application Publication No. 2012-216525 discloses a technique for introducing a gas from a ceiling wall of the chamber.

In such a microwave plasma processing apparatus, an excitation gas such as Ar gas and a processing gas are introduced into the chamber during plasma processing. At this time, an appropriate dissociation state suitable for properties of gases is required. For example, in the case of forming a SiN film by plasma CVD by using $SiH_4$ gas as processing gas and a nitriding gas such as $N_2$ gas, $NH_3$ gas or the like, Ar gas or the nitriding gas such as $N_2$ gas, $NH_3$ gas or the like requires energy that is enough for excitation and dissociation, whereas excessive dissociation of the $SiH_4$ gas needs to be prevented. However, in the case of introducing gas from the ceiling wall of the chamber as disclosed in Japanese Patent Application Publication No. 2012-216525, it is not possible to prevent introduction of gas into a high electron temperature region. Thus, excessive dissociation of the gas such as $SiH_4$ gas or the like which should not be excessively dissociated occurs. Accordingly, gaseous particles are generated or a nozzle is clogged.

On the other hand, Japanese Patent Application Publication No. 2008-47883 discloses a microwave plasma processing apparatus including an upper shower plate provided at a ceiling wall for introducing a microwave and a lower shower plate provided between the upper shower plate and a target substrate. An excitation gas such as Ar gas or the like or a gas to be actively dissociated is introduced from the upper shower plate. A gas that should not be excessively dissociated such as $SiH_4$ gas or the like is introduced from the lower shower plate. In other words, the microwave plasma processing apparatus generates a surface wave plasma by introducing a microwave into a chamber from a ceiling wall. Since, however, an electron temperature of a plasma is highest at a portion directly below the ceiling wall and abruptly decreased at a plasma diffusion region spaced from the ceiling wall, a dissociation state suitable for properties of gases can be realized by utilizing a difference in the electron temperature depending on positions in the chamber.

However, in the microwave plasma processing apparatus disclosed in Japanese Patent Application Publication No. 2008-47883, the lower shower plate has a gas channel and a plurality of openings through which a plasma passes, and the processing gas is introduced from a gas supply port formed at a sidewall of the chamber. Therefore, diffusion of the plasma is disturbed by the gas supply port and the gas channel. Accordingly, a plasma density becomes insufficient, which makes it difficult to obtain a desired rate or film quality controllability. In addition, the uniformity of the plasma becomes insufficient, so that desired in-plane uniformity of the plasma processing may not be obtained.

SUMMARY OF THE INVENTION

In view of the above, the disclosure provides a plasma processing apparatus capable of realizing both of processing gas introduction uniformity and desired plasma uniformity while maintaining a plasma density by dissociating a processing gas to a state suitable for properties of gases, and a gas introduction mechanism used in the plasma processing apparatus.

In accordance with a first aspect, there is provided a plasma processing apparatus including: a chamber; a mounting table configured to mount thereon a target object in the chamber; a plasma source configured to introduce microwaves into the chamber through a ceiling wall of the chamber and generate a surface wave plasma in the chamber; a first gas introduction unit configured to introduce a first gas into the chamber from the ceiling wall; and a second gas introduction unit configured to introduce a second gas into the chamber from a location between the ceiling wall and the mounting table, wherein the second gas introduction unit includes: a ring-shaped member having a plurality of gas injection holes and provided at a predetermined height position between the ceiling wall and the mounting table; and a leg part configured to connect the ceiling wall and the ring-shaped member, and wherein the second gas is supplied to the ring-shaped member through the leg part.

In accordance with a second aspect, there is provided a gas introduction mechanism for introducing gas in a plasma processing apparatus for performing plasma processing on a target object mounted on a mounting table in a chamber by generating a surface wave plasma in the chamber by microwaves introduced into the chamber through a ceiling wall of the chamber, the gas introduction mechanism including: a first gas introduction unit configured to introduce a first gas into the chamber from the ceiling wall; and a second gas introduction unit configured to introduce a second gas into the chamber from a location between the ceiling wall and the mounting table, wherein the second gas introduction unit includes: a ring-shaped member having a plurality of gas injection holes and provided at a predetermined height position between the celling wall and the mounting table; and a leg part connecting the ceiling wall and the ring-shaped member, and wherein the second gas is supplied to the ring-shaped member through the leg part.

In the present disclosure, the processing gas can be dissociated in a state suitable for properties of gases by providing the first gas introducing unit for introducing the first gas into the chamber from the ceiling wall and the second gas introduction unit for introducing the second gas into the chamber from the location between the ceiling wall and the mounting table. The second gas introduction unit includes the ring-shaped member formed at a predetermined height position between the ceiling wall and the mounting table and having a plurality of gas injection holes, and the leg part connecting the ceiling wall and the ring-shaped member. Since the second gas introduction unit supplies the second gas to the ring-shaped member through the leg part, both of the processing gas introduction uniformity and the desired plasma uniformity can be realized while maintaining the plasma density.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings.

(Configuration of Plasma Processing Apparatus)

Figure 1:
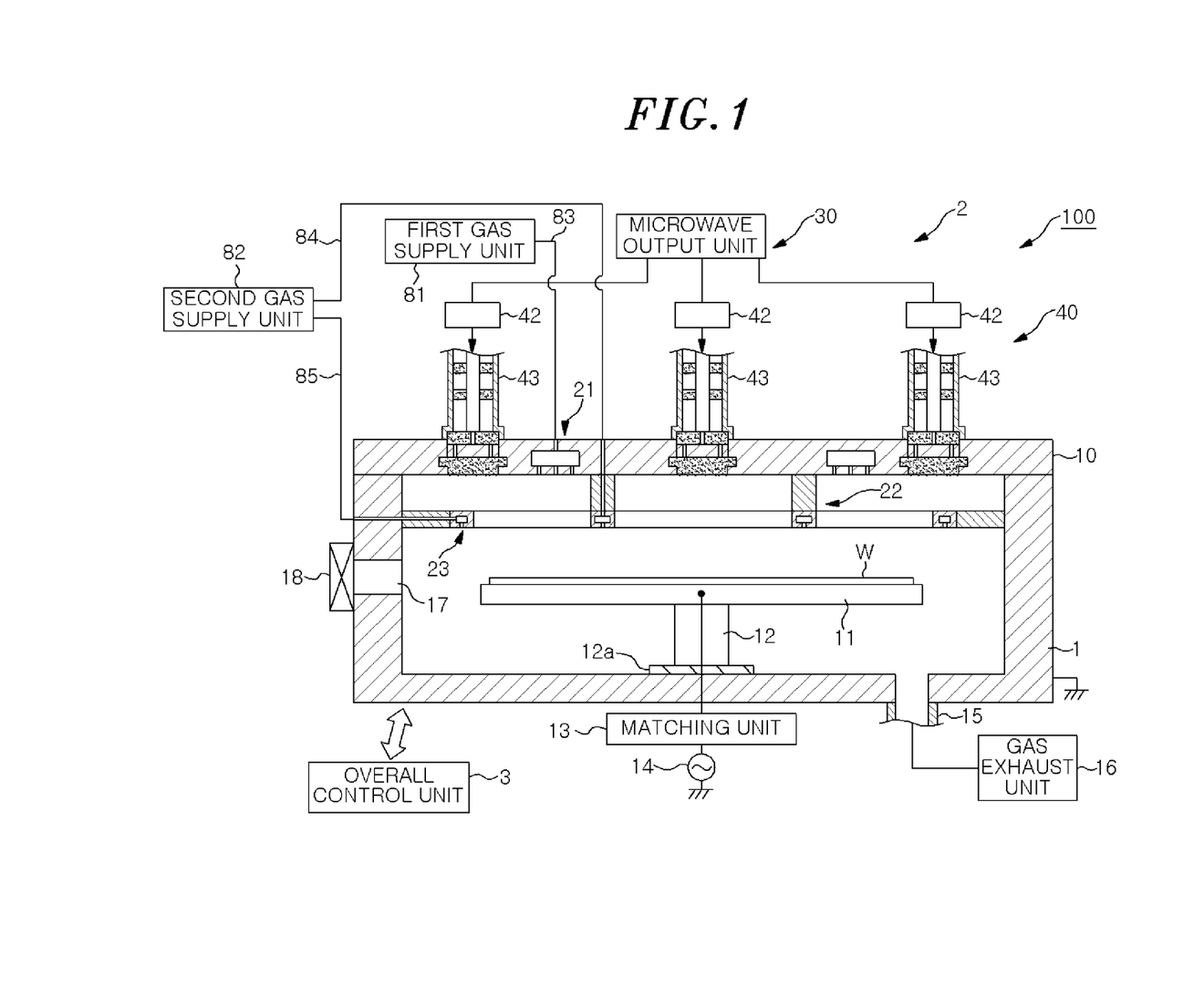
FIG. 1 is a cross sectional view showing a schematic configuration of a plasma processing apparatus according to an embodiment.
Figure 2:
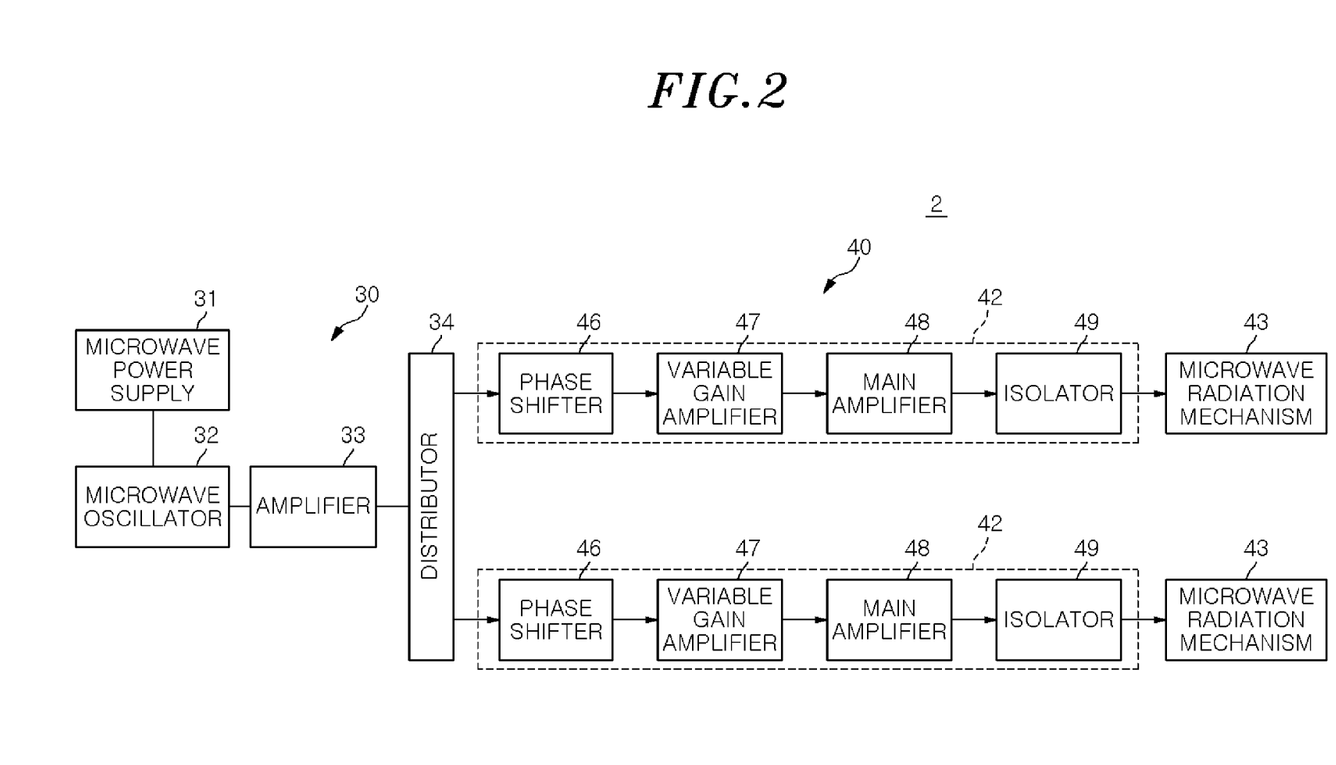
FIG. 2 is a block diagram showing a configuration of a microwave plasma source used in the plasma processing apparatus shown in FIG. 1.
Figure 3:
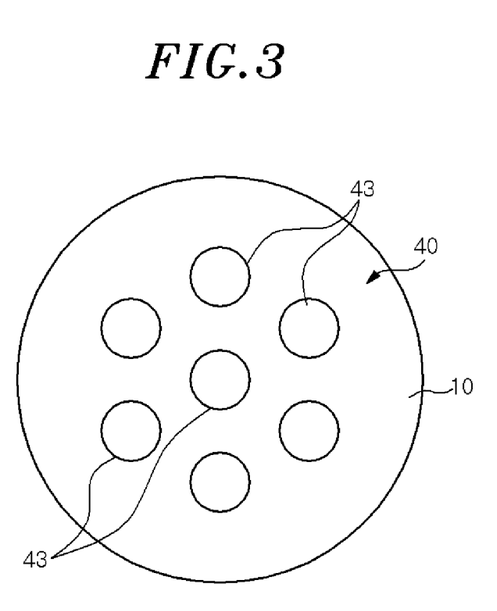
FIG. 3 shows arrangement of microwave radiation mechanisms in the microwave plasma source shown in FIG. 2.

FIG. 1 is a cross sectional view showing a schematic configuration of a plasma processing apparatus according to an embodiment. FIG. 2 is a block diagram showing a configuration of a microwave plasma source used in the plasma processing apparatus shown in FIG. 1. FIG. 3 shows arrangement of microwave radiation mechanisms in the microwave plasma source shown in FIG. 2.

A plasma processing apparatus 100 performs predetermined plasma processing on a wafer by generating a surface wave plasma by microwaves. The plasma processing may be film formation, etching or the like.

The plasma processing apparatus 100 includes a substantially cylindrical airtight chamber 1 that is grounded and made of a metal such as aluminum, stainless steel or the like, and a microwave plasma source 2 for generating a surface wave plasma by introducing microwaves into the chamber 1. A ceiling wall 10 of the chamber 1 is formed by fitting dielectric members of a plurality of microwave radiation mechanisms to be described later to a metallic main body. The microwave plasma source 2 is configured to introduce microwaves into the chamber 1 through a plurality of dielectric members in the ceiling wall 10.

The plasma processing apparatus 100 further includes an overall control unit 3. The overall control unit 3 includes a main controller having a computer (CPU) for controlling the respective components of the plasma processing apparatus 100, a storage device for storing process recipes including process sequence and control parameters of the plasma processing apparatus 100, an input device, an output device, and a display device. The main controller performs predetermined plasma processing based on a process recipe read out from a storage medium of the storage device.

In the chamber 1, a susceptor (mounting table) 11 for horizontally holding a semiconductor wafer W (hereinafter, referred to as "wafer W") as a target object is supported by a cylindrical supporting member 12 provided at a center of a bottom portion of the chamber 1 via an insulating member 12a. The susceptor 11 and the supporting member 12 may be made of, e.g., a metal such as aluminum having an alumite treated (anodically oxidized) surface or an insulator (ceramic or the like) having therein a high frequency electrode.

Although it is not illustrated, the susceptor 11 includes a temperature control mechanism, a gas channel for supplying a heat transfer gas to a backside of the wafer W, and elevating pins movable vertically to transfer the wafer W, or the like. Further, the susceptor 11 may include an electrostatic chuck for attracting and holding the wafer W.

A high frequency bias power supply 14 is electrically connected to the susceptor 11 via a matching unit 13. By supplying a high frequency power from the high frequency bias power supply 14 to the susceptor 11, ions in the plasma are attracted to the wafer W. The high frequency bias power supply 14 may not be provided depending on characteristics of plasma processing. In that case, an electrode is not required even when an insulating member made of ceramic such as AlN or the like is used as the susceptor 11.

A gas exhaust line 15 is connected to the bottom portion of the chamber 1. A gas exhaust unit 16 including a vacuum pump is connected to the gas exhaust line 15. By operating the gas exhaust unit 16, the chamber 1 is exhausted and a pressure in the chamber 1 can be decreased to a predetermined level. Formed at a sidewall of the chamber 1 are a loading/unloading port 17 for loading/unloading the wafer W and a gate valve 18 for opening/closing the loading/unloading port 17.

The plasma processing apparatus 100 includes: a first gas shower unit 21 for injecting a predetermined gas into the chamber 1 from the ceiling wall 10 of the chamber; a second gas shower unit 22 for introducing a gas from a location between the ceiling wall 10 of the chamber 1 and the susceptor 11; and a third gas shower unit 23, provided at the same height position as that of the second gas shower unit 22, for introducing a gas at an outer side of the wafer W. The first to the third gas shower unit 21 to 23 constitute a gas introduction mechanism. The gas introduction mechanism will be described in detail later.

A first gas containing an excitation gas, e.g., Ar gas, or a gas to be dissociated with high energy, among processing gases, is supplied from a first gas supply unit 81 to the first gas shower unit 21 through a line 83. The first gas shower unit 21 injects the first gas into the chamber 1. A second gas that is a gas whose excessive dissociation needs to be prevented among the processing gases is supplied from a second gas supply unit 82 to the second and the third gas shower unit 22 and 23 through lines 84 and 85. The second and the third gas shower unit 22 and 23 inject the second gas into the chamber 1.

For example, when a SiN film is formed by plasma CVD, Ar gas for excitation and $N_2$ gas or $NH_3$ gas that is a nitriding gas requiring high dissociation energy are supplied, as the first gas, from the first gas supply unit 81 to the first gas shower unit 21 and then injected into the chamber 1. Further, $SiH_4$ gas, whose excessive dissociation needs to be prevented, is supplied from the second gas supply unit 82 to the second and the third gas shower unit 22 and 23 and then is injected into the chamber 1.

The microwave plasma source 2 includes a microwave output unit 30 for distributing and outputting microwaves to a plurality of channels, and a microwave transmission unit for transmitting the microwaves outputted from the microwave output unit 30.

As shown in FIG. 2, the microwave output unit 30 has a microwave power supply 31, a microwave oscillator 32, an amplifier 33 for amplifying the oscillated microwave, and a distributor 34 for distributing the amplified microwave to a plurality of channels.

The microwave oscillator 32 oscillates the microwave at a predetermined frequency (e.g., 860 MHz) by using PLL (phase-locked loop), for example. The distributor 34 distributes the microwave amplified by the amplifier 33 while matching an impedance between an input side and an output side so that loss of the microwave can be minimized. The frequency of the microwave is not limited to 860 MHz and may be 915 MHz, 700 MHz, 3 GHz, or the like.

The microwave transmission unit 40 has a plurality of amplifier units 42 and a plurality of microwave radiation mechanisms 43 corresponding to the amplifier units 42. For example, six microwave radiation mechanisms 43 spaced apart from each other at a regular interval are arranged at a peripheral portion of the ceiling wall 10 along a circumferential direction and one microwave radiation mechanism 43 is provided at a central portion of the ceiling wall 10, as can be seen from FIG. 3.

The amplifier units 42 of the microwave transmission unit 40 guide the microwaves distributed by the distributor to the respective microwave radiation mechanisms 43. Each of the amplifier units 42 includes a phase shifter 46, a variable gain amplifier 47, a main amplifier 48 constituting a solid state amplifier, and an isolator 49.

The phase shifter 46 is configured to shift the phase of the microwave, and the radiation characteristics can be modulated by controlling the phase shifter 46. For example, the directivity can be controlled by adjusting the phase in each of the microwave radiation mechanisms to thereby change the plasma distribution. Further, circularly polarized waves can be obtained by shifting the phase by 90° between adjacent microwave radiation mechanisms. The phase shifter can be used to control delay characteristics between components in the amplifier and perform spatial combination in the tuner. However, the phase shifter 46 may not be provided when it is unnecessary to modulate the radiation characteristics or to control the delay characteristics between the components in the amplifier.

The variable gain amplifier 47 controls a power level of the microwave to be inputted to the main amplifier 48 and adjusts a plasma intensity. By controlling the variable gain amplifier 47 for each of the amplifier units 42, it is possible to adjust the distribution of the generated plasma.

The main amplifier 48 constituting the solid state amplifier may have, e.g., an input matching circuit, a semiconductor amplifying device, an output matching circuit, and a high Q resonant circuit.

The isolator 49 separates a reflected microwave reflected by a planar antenna to be described later toward the main amplifier 48. The isolator 49 has a circulator and a dummy load (coaxial terminator). The circulator guides the reflected microwave to the dummy load, and the dummy load converts the reflected microwave guided by the circulator into heat.

Figure 4:
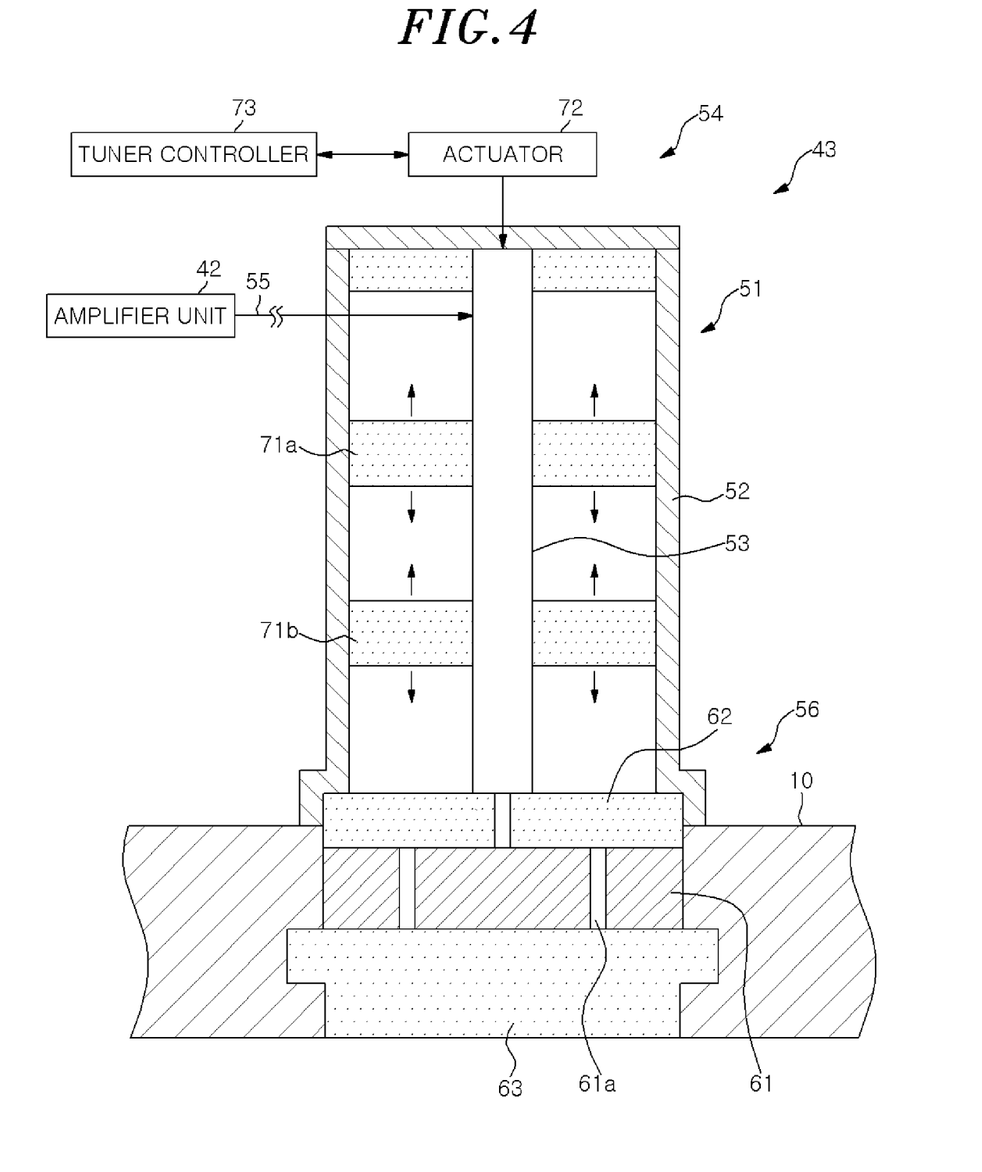
FIG. 4 is a cross sectional view showing the microwave radiation mechanism in the microwave plasma source of the plasma processing apparatus shown in FIG. 1.

The microwave radiation mechanism 43 has a function of radiating the microwave outputted from the amplifier unit 42 into the chamber 1 and a function of matching an impedance.

As shown in FIG. 4, the microwave radiation mechanism 43 includes: a coaxial tube 51 having a cylindrical outer conductor 52, an inner conductor 53 coaxially arranged within the outer conductor 52, and a microwave transmission path provided therebetween; a power supply antenna (not shown) for supplying the microwave amplified by the amplifier unit 42 to the coaxial tube 51 through a coaxial cable 55; a tuner 54 for matching an impedance of a load to a characteristic impedance of the microwave power supply 31; and an antenna unit 56 for radiating the microwave from the coaxial tube 51 into the chamber 1.

By radiating from the power supply antenna the microwave supplied from a side of an upper end portion of the outer conductor 52 through the coaxial cable 55, a microwave power is supplied to the microwave transmission path between the outer conductor 52 and the inner conductor 53 and then propagates toward the antenna unit 56.

The antenna unit 56 is provided at a lower end portion of the coaxial tube 51 and fitted to a metallic part of the ceiling wall 10 of the chamber 1. The antenna unit 56 includes a planar antenna 61 connected to a lower end portion of the inner conductor 53, a wave retardation member 62 provided on a top surface of the planar antenna 61, and a dielectric window 63 provided at a bottom surface of the planar antenna 61.

The planar antenna 61 has slots 61a penetrating therethrough in a thickness direction. The shape of the slots 61a is appropriately set such that the microwaves can be effectively radiated. A dielectric material may be inserted in the slots 61a.

The wave retardation member 62 is made of a dielectric material having a dielectric constant greater than vacuum.

The wave retardation member 62 has a function of shortening the wavelength of the microwave to thereby reduce the size of the antenna. The phase of the microwave can be adjusted by the thickness of the wave retardation member 62. By adjusting the thickness of the wave retardation member 62 such that an antinode of the standing wave is formed at a contact portion of the planar antenna 61, the radiation energy of the microwave can be maximized.

The dielectric window 63 is made of the same dielectric material as that of the wave retardation member 62 and fitted to the metallic part of the ceiling wall 10. A bottom surface of the dielectric window 63 is exposed to an inner space of the chamber 1. The dielectric window 63 has a shape that allows the microwave to be radiated effectively in a TE mode. The microwave transmitting through the dielectric window 63 generates a surface wave plasma directly below the dielectric window 63.

The wave retardation member 62 and the dielectric window 63 may be made of, e.g., quartz, ceramic, a fluorine-based resin such as polytetrafluoroethylene or the like, or a polyimide-based resin.

The tuner 54 forms a slug tuner. The tuner 54 includes two slugs 71a and 71b positioned close to a base end side (upper end side) of the coaxial tube 51 compared to the antenna unit 56, an actuator 72 for individually driving the two slugs, and a tuner controller 73 for controlling the actuator 72.

The slugs 71a and 71b are formed in a plate shape or an annular shape and made of a dielectric material such as ceramic or the like. The slugs 71a and 71b are provided between the outer conductor 52 and the inner conductor 53 of the coaxial tube 51. The actuator 72 individually drives the slugs 71a and 71b by rotating, e.g., two screws provided inside the inner conductor 53 and respectively screw-coupled to the slugs 71a and 71b. Further, the actuator 72 moves the slugs 71a and 71b up and down based on an instruction from the tuner controller 73. When only one of the two slugs is moved, a trajectory of the impedance passes through the origin of the smith chart. When both of the two slugs are moved at the same time, only the phase of the impedance is rotated. The tuner controller 73 performs impedance matching by controlling the positions of the slugs 71a and 71b such that an impedance of a terminal becomes 50Ω.

The main amplifier 48, the tuner 54, and the planar antenna 61 are arranged close to one another. The tuner 54 and the planar antenna 61 form a lumped constant circuit and serve as a resonator. An impedance mismatching occurs at a connection portion of the planar antenna 61. Since, however, the plasma load can be directly tuned by the tuner 54, the plasma and the like can be tuned with high accuracy. Accordingly, the effect of the reflection in the planar antenna 61 can be eliminated.

Next, a gas introduction mechanism will be described with reference to FIGS. 1 and 5 to 7.

Figure 5:
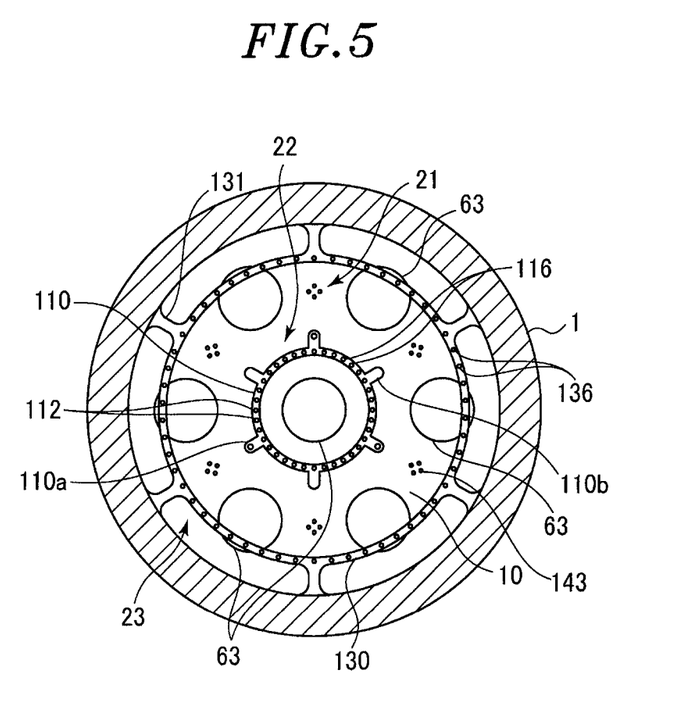
FIG. 5 is a horizontal cross sectional view of the plasma processing apparatus shown in FIG. 1.
Figure 6:
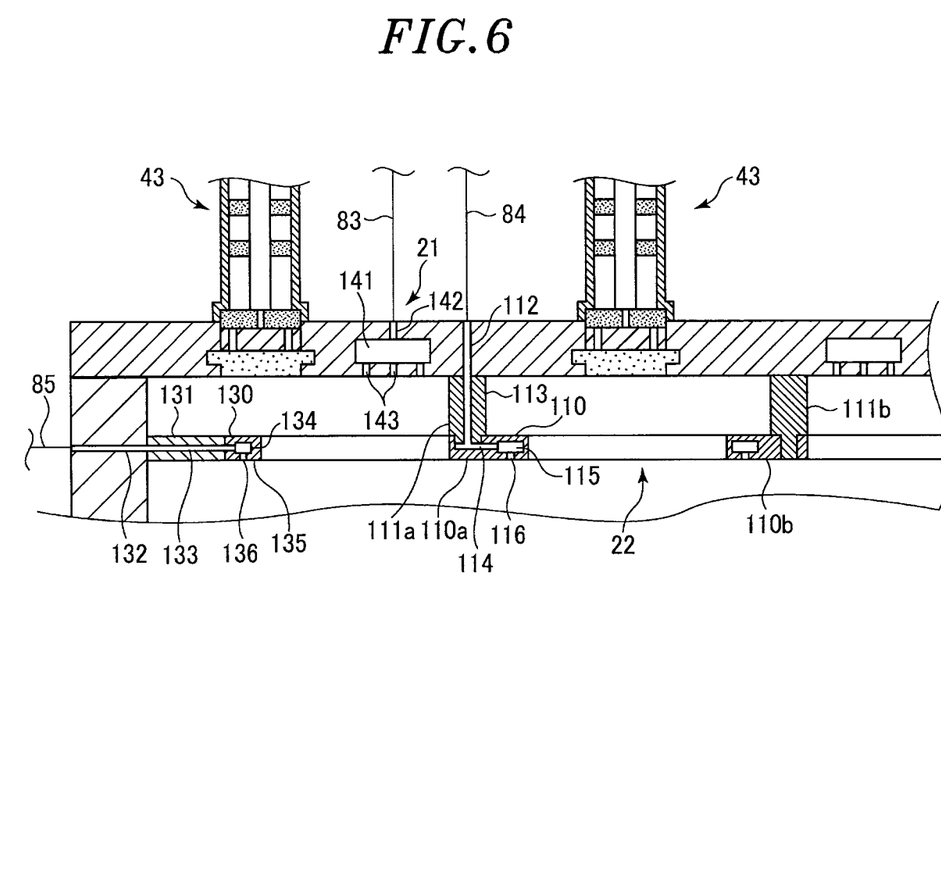
FIG. 6 is an enlarged cross sectional view showing a part of a gas introduction unit of the plasma processing apparatus shown in FIG. 1.
Figure 7:
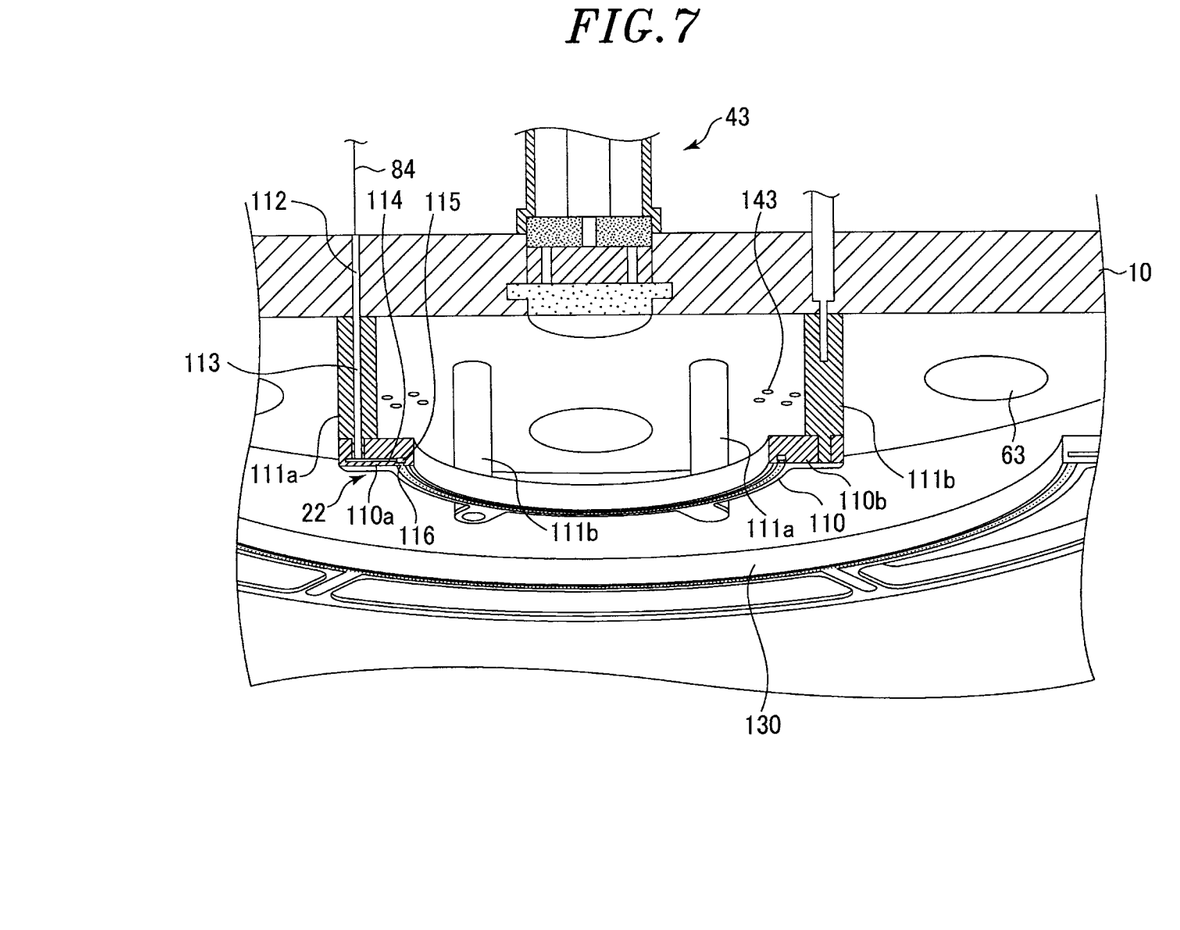
FIG. 7 is a cross sectional view showing a second gas shower unit.

FIG. 5 is a horizontal cross sectional view of the plasma processing apparatus shown in FIG. 1. FIG. 6 is an enlarged cross sectional view showing a part of a gas introduction unit of the plasma processing apparatus shown in FIG. 1. FIG. 7 is a cross sectional view showing the second gas shower unit.

As shown in FIGS. 1 and 5, the gas introduction mechanism includes the first gas shower unit 21, the second gas shower unit 22, and the third gas shower unit 23. The first gas shower unit 21 injects a gas from the ceiling wall 10 of the chamber 1. The second gas shower unit 22 injects a gas from a first ring-shaped member 110 provided between the ceiling wall 10 and the susceptor 11. The third gas shower unit 23 injects a gas from a second ring-shaped member 130 provided concentrically at an outer side of the first ring-shaped member 110.

As shown in FIG. 6, the first gas shower unit 21 includes a gas diffusion space 141 formed at the metallic part of the ceiling wall 10, a gas inlet hole 142 formed at a top surface of the gas diffusion space 141, and a plurality of gas injection holes 143 extending from the gas diffusion space 141 to the chamber 1. The line 83 is connected to the gas inlet hole 142. Therefore, the first gas containing the excitation gas, e.g., Ar gas, or a gas to be dissociated with high energy, among the processing gases, which is supplied from the first gas supply unit 81 through the line 83 is supplied from the ceiling wall 10 of the chamber 1. As shown in FIG. 5, a plurality of (four in the drawing) gas injection holes 143 is provided between the adjacent microwave radiation mechanisms 43 arranged at the peripheral portion. The positions and the number of the gas injection holes 143 are not limited to those in the illustrated example.

As shown in FIGS. 5 to 7, the second gas shower unit 22 includes the first ring-shaped member 110 provided at a central portion between the ceiling wall 10 and the susceptor 11 and three first leg parts 111a and three second leg parts 111b connecting the ceiling wall 10 and the first ring-shaped member 110. The first and the second leg parts 111a and 111b are provided at portions of the metallic part of the ceiling wall 10 where the first gas shower unit 21 is not disposed.

The first ring-shaped member 110 injects the second gas whose excessive dissociation needs to be suppressed, among processing gases, such as $SiH_4$ and the like to a region where the electron temperature of the plasma is relatively low. In this example, the first ring-shaped member 110 is disposed at a position corresponding to the central portion of the wafer W. The first ring-shaped member 110 is preferably made of a conductor such as a metal or the like, especially a metal having high conductivity, e.g., aluminum, in order to prevent intrusion of the microwave during plasma ignition. The first ring-shaped member 110 may be made of a pure base material. However, the first ring-shaped member may be subjected to spraying of ceramic such as $Y_2O_3$ or the like, alumite treatment (anodic oxidation), blast processing or the like in order to control contamination. The first ring-shaped member 110 may be made of a dielectric material as long as abnormal discharge does not occur.

The first ring-shaped member 110 has therein a ring-shaped space 115 serving as a gas channel. Further, the first ring-shaped member 110 has a plurality of gas injection holes 116 for injecting a gas downward from the space 115. The gas injection holes 116 may extend from the space 115 while being inclined by a certain angle with respect to the vertical direction.

A diameter of the gas injection holes 116 is preferably 0.5 mm or less, e.g., 0.1 mm, 0.3 mm or 0.5 mm, in order to prevent intrusion of plasma. The diameter of the gas injection holes 116 may be further smaller to, e.g., about 5 μm that is considered as a machining limit. The number of the gas injection holes 116 is properly set depending on the diameter of the first ring-shaped member 110, desired gas uniformity, gas flow rate and the like. At this time, it is preferable to set the number of the gas injection holes 116 such that a pressure in the first ring-shaped member 110 becomes higher than a pressure in the chamber 1 by twice or more. The actual number of the gas injection holes 116 is set within a range from 6 to 200 and preferably from 12 to 72.

The space 115 formed in the first ring-shaped member 110 serves as a gas channel for supplying gas to the gas injection holes 116. In order to uniformly inject the gas through the gas injection holes 116 by decreasing a pressure gradient, it is preferable to set a diameter of the space 115 such that a flow velocity of the gas in the space 115 becomes ½₀ or less of a flow velocity of the gas in the gas injection holes 116 by ½₀. Accordingly, the gas supplied from the second gas supply unit 82 can be appropriately buffered/diffused and uniformly introduced into the chamber 1 through the gas injection holes 116.

In order to uniformly introduce the processing gas, it is preferable to optimize the diameter of the first ring-shaped member 110 depending on types of processing gases, a pressure, a shape of the chamber, or the like. The diameter of the first ring-shaped member 110 may vary within a range from 30 mm to 505 mm. The diameter of the first ring-shaped member 110 is preferably smaller than the diameter of the wafer. For example, when a SiN film is formed by plasma CVD, $SiH_4$ gas is injected from the second gas shower unit 22. In that case, the diameter of the first ring-shaped member 110 is set to about 80 mm to 320 mm, e.g., 160 mm.

In this example, the first ring-shaped member 110 has a rectangular cross sectional shape. However, the cross sectional shape of the first ring-shaped member 110 is not limited thereto and may be an inverted triangular or a circular cross sectional shape in view of suppression of plasma shielding. It is preferable that a corner portion of the first ring-shaped member 110 is rounded to have a curvature radius R in order to reduce concentration of an electric field at the corner portion. Preferably, R is greater than or equal to R1.

In the drawing, the first ring-shaped member 110 has an annular shape. However, the ring shape is not limited to the annular shape and may be a polygonal shape or the like.

The first and the second leg parts 111a and 111b have a function of holding the first ring-shaped member 110 at a desired height position. The first leg parts 111a have a function of supplying a gas to the first ring-shaped member 110. The second leg parts 111b serve as a cooling member for cooling the first ring-shaped member 110 and cooling the injected gas (temperature control). The first leg parts 111a and the second leg parts 111b are arranged alternately.

The first and the second leg parts 111a and 111b are preferably made of a metal having high thermal conductivity, e.g. aluminum. Further, the first and the second leg parts 111a and 111b may be made of a pure base material or may be subjected to the same surface treatment as that performed on the first ring-shaped member 110.

The first and the second leg parts 111a and 111b are uprightly extended and overlapped with the first ring-shaped member 110 when the ceiling wall is vertically viewed from the wafer.

A first connecting part 110a is formed at the first ring-shaped member 110. The first leg part 111a is connected to the first connecting part 110a. The first leg part 111a has therein a vertical channel 113 through which the gas supplied from the line 84 through a flow channel 112 formed in the ceiling wall 10 flows vertically. A horizontal channel 114 extending horizontally from a lower end of the vertical channel 113 is formed at the first connecting part 110 and the first ring-shaped member 110. The horizontal channel 114 is connected to the space 115. Therefore, the second gas that is a processing gas whose excessive dissociation needs to be prevented and which is supplied from the second gas supply unit 82 through the line 84 and the flow channel 112 reaches the space 115 through the vertical channel 113 and the horizontal channel 114 and then is injected downward through the gas injection holes 116.

The first and the second leg parts 111a and 111b preferably have positional relation in which they are completely overlapped with the first ring-shaped member 110. However, the first and the second leg parts 111a and 111b may not have such positional relation. In this example, the first and the second leg parts 111a and 111b are partially overlapped with the first ring-shaped member 110. Therefore, in this example, the horizontal channel 114 is required between the vertical channel 113 and the space 115. However, when the first and the second leg parts 111a and 111b are completely overlapped with the first ring-shaped member 110, the horizontal channel 114 is not required. FIG. 1 schematically shows the second gas shower unit 22 and also illustrates a state in which the horizontal channel 114 does not exist due to the complete overlap between the first and the second leg parts 111a and 111b and the first ring shaped member 110.

A second connecting part 110b is formed at the first ring-shaped member 110. The second connecting part 110b is connected to the second leg part 111b. The second leg part 111b is not provided with a gas channel. The second leg part 111b is formed as a solid member and configured to cool the first ring-shaped member 110.

The cooling may be performed by providing a cooling gas channel at the second leg part 111b and supplying a cooling gas. Further, the first leg part 111a for gas supply may have a cooling function. When the cooling is not required, the second leg part 111b is not required. The number of the leg parts for gas supply is not limited and may be one or more. As the number of the leg parts is increased and as a gap between the leg parts is decreased, the uniformity of the plasma tends to deteriorate. Therefore, it is preferable to set the number of the leg parts and the gap between the leg parts such that desired plasma uniformity can be ensured. As long as the desired plasma uniformity is ensured, it is possible to reduce the gap between the leg parts and increase the number of the leg parts in order to intentionally shield the plasma. The gap between the leg parts is preferably set such that an inscribed circle has a diameter of ϕ30 mm or more, e.g., ϕ80 mm.

In view of the plasma uniformity, it is preferable that the first and the second leg parts 111a and 111b have a small diameter. However, a diameter greater than a certain level is required in order to support the first ring-shaped member 110, provide a vertical channel for gas supply and ensure thermal conductivity. The diameter is preferably within a range from ϕ5 mm to ϕ20 mm, e.g., 15 mm.

Lengths of the first and the second leg parts 111a and 111b determine the position of the first ring-shaped member 110, i.e., the height position for gas injection. Therefore, the lengths of the first and the second leg parts 111a and 111b are optimized such that a desired dissociation degree of the injected gas is obtained and appropriately set within a range from 20 mm to 200 mm from the inner surface of the ceiling wall 10. In the case of supplying $SiH_4$ gas as the processing gas, the lengths of the first and the second leg parts 111*a* and 111*b* are preferably within a range from 30 mm to 150 mm and set to, e.g., 80 mm.

The number of connection locations between the first and the second leg parts 111*a* and 111*b* and the ceiling wall 10 is preferably the same as the number of locations corresponding to nodes of the electric field of the surface wave generated by the plasma source 2.

The first and the second leg parts 111*a* and 111*b* and the ceiling wall 10 of the chamber 1 may be formed as one unit or separate units. When the first and the second leg parts 111*a* and 111*b* and the ceiling wall 10 of the chamber 1 are formed as separate units, it is required to have the electrically same potential by complete bonding with the ceiling wall 10 and reliably prevent gas leakage.

The second gas shower unit 22 may have a plurality of leg parts corresponding to the first and the second leg parts 111*a* and 111*b*. The leg parts of the second gas shower unit 22 may be arranged concentrically at a diametrically inner or outer side.

As shown in FIGS. 5 and 6, the third gas shower unit 23 injects the second gas that is a processing gas whose excessive dissociation needs to be suppressed to an outer portion of the wafer W. The third gas shower unit 23 has the second ring-shaped member 130 provided concentrically at the outer side of the first ring-shaped member 110 and at the outer side of the wafer W, and a plurality of beam parts 131 connecting the sidewall of the chamber 1 and the second ring-shaped member 130. The beam parts 131 are formed at regions that are not overlapped with the wafer W when seen from the top.

A ring-shaped space 134 is formed in the second ring-shaped member 130. The second ring-shaped member 130 has a plurality of gas injection holes 136 for injecting a gas downward from the space 134. The gas injection holes 136 may extend from the space 134 while being inclined by a certain angle with respect to the vertical direction, or may be formed in a horizontal direction.

A gas supply path 133 through which the gas supplied from the line 85 through a flow channel 132 formed in the sidewall of the chamber 1 flows is formed at a part or all of the beam parts 131. The gas supply path 133 and the space 134 are connected by a connection channel 135.

Therefore, the second gas whose excessive dislocation needs to be prevented and which is supplied from the second gas supply unit through the line 85 and the flow channel 132 reaches the space 134 through the gas supply path 133 and the connection channel 135 and then is injected downward through the gas injection holes 136.

The material of the second ring-shaped member 130 of the third gas shower unit 23, the diameter of the space 134, the diameter of the gas injection holes 136, the number of the gas injection holes 136 and the like are appropriately set based on those in the second gas shower unit 22.

The second ring-shaped member 130 may be disposed at the height position at which the excessive dissociation of the gas injected through the gas injection holes 136 can be prevented. The height position of the second ring-shaped member 130 may not be the same as that of the first ring-shaped member 110. The shape of the second ring-shaped member is not limited to an annular shape and may be another shape such as a polygonal shape or the like as long as it is the ring shape.

(Operation of the Plasma Processing Apparatus)

Hereinafter, an operation of the plasma processing apparatus 100 configured as described above will be described.

First, the wafer W is loaded into the chamber 1 and mounted on the susceptor 11. The inside of the chamber 1 is exhausted by the gas exhaust unit 16, and a pressure in the chamber 1 is controlled to a predetermined pressure. Then, the first gas containing an excitation gas, e.g., Ar gas, for plasma generation or a gas that requires high energy for dissociation, among processing gases, is supplied from the first gas supply unit 81 to the first gas shower unit 21 formed at the ceiling wall 10 through the line 83. These gases are injected from the first gas shower unit 21 into the chamber 1.

The microwaves transmitted from the microwave output unit 30 of the microwave plasma source 2 through the amplifier units 42 of the microwave transmission unit 40 and the transmission paths of the microwave radiation mechanisms are radiated into the chamber 1 through the wave retardation member 62 of the antenna unit 56 fitted to the ceiling wall 10, the slots 61*a* of the planar antenna 61, and the dielectric window 63. At this time, the impedance is automatically matched by the slugs 71*a* and 72*b* of the tuner 54 and the microwaves are supplied in a state where the power reflection substantially does not occur. The microwaves radiated from the microwave radiation mechanisms are spatially combined, and a surface wave plasma is generated near the surface of the dielectric window 63 of the ceiling wall 10 by the microwave electric field. At this time, the electron temperature of the surface wave plasma is high near the ceiling wall 10 and the first gas is dissociated with high energy.

The second gas that is a gas whose excessive dissociation needs to be prevented among the processing gases is supplied from the second gas supply unit 82 to the second and the third gas shower unit 22 and 23 through the lines 84 and 85 and then is injected from the second and the third gas shower unit 22 and 23 into the chamber 1. The second gas injected from the second and the third gas shower unit 22 and 23 is excited by the plasma of the first gas. At this time, the arrangement positions of the first ring-shaped member 110 having the gas injection holes 116 of the second gas shower unit 22 and the second ring-shaped member 130 having the gas injection holes 136 of the third gas shower unit 23 are positions spaced from the surface of the ceiling wall 10, from which the microwaves are radiated, where the energy is lower. Therefore, the second gas is excited in a state where the excessive dissociation is suppressed. The wafer W is subjected to plasma processing by the plasmas of the first and the second gas.

For example, when a SiN film is formed by plasma CVD, Ar gas for excitation and $N_2$ gas or $NH_3$ gas that is a nitriding gas requiring high dissociation energy is supplied as the first gas from the first gas supply unit 81 to the shower unit 21 and then injected into the chamber 1. As a consequence, a plasma is generated. $SiH_4$ gas, whose excessive dissociation needs to be prevented, is supplied as the second gas from the second gas supply unit 82 into the second and the third gas shower unit 22 and 23 and then injected into the chamber 1. Thus, the second gas is excited in a state where the excessive dissociation is suppressed.

Accordingly, the dissociation of the gas can be controlled depending on properties of gases by using a difference in an electron temperature depending on positions in the chamber. Therefore, it is possible to suppress generation of gaseous reaction particles by the excessive dissociation of the second gas that is a processing gas such as $SiH_4$ gas or the like which is easily excessively dissociated or suppress clog of the nozzle (gas injection holes).

Since the second gas shower unit 22 injects a gas from the gas injection holes 116 formed at the first ring-shaped member 110, the uniformity of the plasma in the circumferential direction can be maintained at a high level by the first ring-shaped member 110 and the influence of the first ring-shaped member 110 on the uniformity of the plasma in the diametrical direction is limited. Further, since the gas is supplied to the first ring-shaped member 110 through the first leg parts 111a connecting the ceiling wall 10 and the first ring-shaped member 110, the influence of the first leg parts 111a on the uniformity of the plasma is limited. By appropriately controlling the number of leg parts including the first and the second leg parts 111a and 111b, desired plasma uniformity can be obtained. Especially, in the present embodiment, when the ceiling wall of the chamber 1 is vertically viewed from the wafer, the leg parts 111a and 111b are overlapped with the first ring-shaped member 110 and, thus, the influence of the leg parts 111a and 111b on the uniformity of the plasma can be reduced. By optimizing the number of the gas injection holes 116 while maintaining the outer shape of the first ring-shaped member 110, the desired gas introduction uniformity (uniformity in the circumferential direction) can be obtained. Therefore, the processing gas introduction uniformity can be obtained while maintaining the uniformity of the plasma.

In other words, in the present embodiment, the processing gas can be dissociated to a state suitable for properties of gases and, also, both of the processing gas introduction uniformity and the desired plasma uniformity can be obtained.

By providing the second leg parts 111b serving as the cooling member in addition to the first leg parts 111a for gas supply, the temperature of the gas injected through the first ring-shaped member 110 can be controlled by the second leg parts 111b.

By providing the third gas shower unit 23 at the outer side of the second gas shower unit 22 and injecting the second gas from the gas injection holes 136 formed at the second ring-shaped member 130 of the third gas shower unit 23, the uniformity of the second gas can be further improved.

In that case, the second ring-shaped member 130 of the third gas shower unit 23 is connected to the sidewall of the chamber 1 by the beam parts 131 and the gas is introduced through the beam parts 131. Since the beam parts 131 are provided at the outer side of the wafer when seen from the top, the uniformity of the plasma is hardly affected by the beam parts 131.

In the present embodiment, the ceiling wall 10 has a structure in which the dielectric windows 63 of the microwave radiation mechanisms 43 are fitted to the metallic main body. Therefore, it is easy to bond the leg parts 111a and 111b of the second gas shower unit 22 to the metallic part of the ceiling wall 10 by welding or the like. It is also easy to form the metallic part of the ceiling wall 10 and the leg parts 111a and 111b as one unit.

By spatially combining the plasma by using the microwave radiation mechanisms 43, phases or intensities of the microwaves introduced from the microwave radiation mechanisms 43 can be individually controlled. Accordingly, the plasma distribution can be relatively easily controlled, which makes it possible to perform plasma processing with high controllability.

(Other Applications)

While the embodiments have been described with reference to the accompanying drawings, the present disclosure is not limited to the above embodiments and can be variously modified within the scope of the present disclosure.

For example, although seven microwave radiation mechanisms are provided in the above embodiments, the number of the microwave radiation mechanisms is not limited thereto and may be any number as long as the uniformity of the plasma can be ensured.

The above embodiments have described the example in which a plasma processing apparatus of a type in which microwaves are radiated from a plurality of microwave radiation mechanisms is used and the leg parts of the second gas shower units are provided at the metallic part of the ceiling wall where the dielectric windows of the microwave radiation mechanisms are not disposed. However, microwaves may be introduced from a single microwave radiation mechanism through a dielectric window as long as the ceiling wall has the metallic part and the leg parts are provided. The leg parts may be provided at a dielectric portion of the ceiling wall.

In the above embodiments, the plasma CVD for forming a SiN film by using $SiH_4$ gas and a nitriding gas ($N_2$ gas or $NH_3$ gas) has been described as an example of the plasma processing. However, the present disclosure is not limited thereto and can be applied to plasma processing using a processing gas containing a gas whose excessive dissociation needs to be prevented and a gas to be dissociated with high energy. Further, the present disclosure can be applied to film formation of an SiCN film, a CF film, a BN film, an $SiO_2$ film, an SiON film or the like, or to etching other than the film formation.

The target object is not limited to a semiconductor wafer and may be another substrate such as an FPD (Flat Panel Display) substrate represented by a substrate for use in LCD (Liquid Crystal Display), a ceramic substrate or the like.

While the disclosure has been shown and described with respect to the embodiments, it will be understood by those skilled in the art that various changes and modifications may be made without departing from the scope of the disclosure as defined in the following claims.

What is claimed is:
1. A plasma processing apparatus comprising:
a chamber;
a mounting table configured to mount thereon a target object in the chamber;
a plasma source configured to introduce microwaves into the chamber through a ceiling wall of the chamber and generate a surface wave plasma in the chamber;
a first gas introduction unit configured to introduce a first gas into the chamber from the ceiling wall; and
a second gas introduction unit configured to introduce a second gas into the chamber from a location between the ceiling wall and the mounting table,
wherein the second gas introduction unit includes:
a first ring-shaped member having a plurality of gas injection holes and provided at a predetermined height position between the ceiling wall and the mounting table; and
a leg part configured to connect the ceiling wall and the first ring-shaped member, and
wherein the second gas is supplied to the first ring-shaped member through the leg part,
wherein the leg part is uprightly extended and an extending direction of the leg part is perpendicular to a plane where the first ring-shaped member is located, and
the ceiling wall faces the plane where the first ring-shaped member is located.

2. The plasma processing apparatus of claim 1, wherein the ceiling wall has a dielectric window through which the microwave transmits and a metallic part to which the dielectric window is fitted,
the first gas introduction unit is disposed at the metallic part of the ceiling wall, and
the leg part is provided at a portion of the metallic part where the first gas introduction unit is not disposed.

3. The plasma processing apparatus of claim 2, wherein the plasma source has a plurality of microwave radiation mechanisms configured to introduce microwaves into the chamber, and the ceiling wall has the dielectric window provided at positions corresponding to the respective microwave radiation mechanisms.

4. The plasma processing apparatus of claim 1, wherein the leg part is overlapped with the first ring-shaped member of the second gas introduction unit when the ceiling wall is vertically viewed from time target object on the mounting table.

5. The plasma processing apparatus of claim 1, wherein the leg part comprises a plurality of leg parts,
wherein some of the leg parts serve as a gas supply member configured to supply the second gas to the first ring-shaped member and the remaining leg parts serve as a cooling member configured to cool the first ring-shaped member.

6. The plasma processing apparatus of claim 1, further comprising a third gas introduction unit provided at an outer region of the second gas introduction unit and configured to introduce the second gas into the chamber,
wherein the third gas introduction unit includes a second ring-shaped member having a plurality of gas injection holes and provided at a height position between the ceiling wall and the mounting table at an outer side of the first ring-shaped member.

7. The plasma processing apparatus of claim 6, wherein the third gas introduction unit further includes a beam part connecting a sidewall of the chamber and the second ring-shaped member,
the second gas is supplied to the second ring-shaped member through the beam part, and
the beam part is formed at a region that is not overlapped with the target object on the mounting table when seen from above.

8. A gas introduction mechanism for introducing gas in a plasma processing apparatus for performing plasma processing on a target object mounted on a mounting table in a chamber by generating a surface wave plasma in the chamber by microwaves introduced into the chamber through a ceiling wall of the chamber, the gas introduction mechanism comprising:
a first gas introduction unit configured to introduce a first gas into the chamber from the ceiling wall; and
a second gas introduction unit configured to introduce a second gas into the chamber from a location between the ceiling wall and the mounting table,
wherein the second gas introduction unit includes:
a first ring-shaped member having a plurality of gas injection holes and provided at a predetermined height position between the ceiling wall and the mounting table; and
a leg part connecting the ceiling wall and the first ring-shaped member,
wherein the second gas is supplied to the first ring-shaped member through the leg part,
wherein the leg part is uprightly extended and an extending direction of the leg part is perpendicular to a plane where the first ring-shaped member is located, and
the ceiling wall faces the plane where the first ring-shaped member is located.

9. The gas introduction mechanism of claim 8, wherein the ceiling wall includes:
a dielectric window through which the microwaves transmit; and
a metallic part to which the dielectric window is fitted,
wherein the first gas introduction unit is disposed at the metallic part of the ceiling wall, and the leg part is formed at a portion of the metallic part where the first gas introduction unit is not disposed.

10. The gas introduction mechanism of claim 8, wherein the leg part is overlapped with the first ring-shaped member of the second gas introduction unit when vertically viewed from the target object on the mounting table.

11. The gas introduction mechanism of claim 8, wherein the leg part comprises a plurality of leg parts,
wherein some of the leg parts serve as a gas supply member configured to supply the second gas to the first ring-shaped member and the remaining leg parts serve as a cooling member configured to cool the first ring-shaped member.

12. The gas introduction mechanism of claim 8, further comprising:
a third gas introduction unit provided at an outer region of the second gas introduction unit and configured to introduce the second gas into the chamber,
wherein the third gas introduction unit includes:
a second ring-shaped member having a plurality of gas injection holes and provided at a height position between the ceiling wall and the mounting table at an outer side of the first ring-shaped member.

13. The gas introduction mechanism 12, wherein the third gas introduction unit further includes a beam part connecting a sidewall of the chamber and the second ring-shaped member,
the second gas is supplied to the second ring-shaped member through the beam part, and
the beam part is formed at a region that is not overlapped with the target object on the mounting table when seen from above.

* * * * *